(12) United States Patent
Harada et al.

(10) Patent No.: US 10,494,735 B2
(45) Date of Patent: Dec. 3, 2019

(54) CRYSTAL GROWTH APPARATUS, METHOD FOR MANUFACTURING SILICON CARBIDE SINGLE CRYSTAL, SILICON CARBIDE SINGLE CRYSTAL SUBSTRATE, AND SILICON CARBIDE EPITAXIAL SUBSTRATE

(71) Applicant: Sumitomo Electric Industries, Ltd., Osaka-shi, Osaka (JP)

(72) Inventors: Shin Harada, Itami (JP); Tsutomu Hori, Itami (JP); Sho Sasaki, Itami (JP); Tetsuya Kishida, Itami (JP)

(73) Assignee: Sumitomo Electric Industries, Ltd., Osaka-shi, Osaka (JP)

( * ) Notice: Subject to any disclaimer, the term of this patent is extended or adjusted under 35 U.S.C. 154(b) by 184 days.

(21) Appl. No.: 15/529,167

(22) PCT Filed: Dec. 17, 2015

(86) PCT No.: PCT/JP2015/085350
§ 371 (c)(1),
(2) Date: May 24, 2017

(87) PCT Pub. No.: WO2016/117251
PCT Pub. Date: Jul. 28, 2016

(65) Prior Publication Data
US 2017/0335486 A1 Nov. 23, 2017

(30) Foreign Application Priority Data

Jan. 21, 2015 (JP) .................................. 2015-009432
Jul. 17, 2015 (WO) .................. PCT/JP2015/070519

(51) Int. Cl.
*C30B 23/00* (2006.01)
*C30B 23/02* (2006.01)
(Continued)

(52) U.S. Cl.
CPC ........ *C30B 23/025* (2013.01); *C23C 14/0635* (2013.01); *C23C 14/24* (2013.01);
(Continued)

(58) Field of Classification Search
CPC .......... C30B 23/00; C30B 23/03; C30B 29/36
See application file for complete search history.

(56) References Cited

U.S. PATENT DOCUMENTS 5,415,126 A * 5/1995 Loboda .................... C30B 29/36
117/88
6,056,820 A * 5/2000 Balakrishna ............ C30B 23/00
117/200
(Continued)

FOREIGN PATENT DOCUMENTS

EP       2 471 981 A1    7/2012
JP       2001-512789 A   8/2001
(Continued)

OTHER PUBLICATIONS

Office Action dated Nov. 2, 2018 that issued in U.S. Appl. No. 15/743,950.

*Primary Examiner* — Robert M Kunemund
(74) *Attorney, Agent, or Firm* — Drinker Biddle & Reath LLP

(57) ABSTRACT

A crystal growth apparatus includes: a chamber including a gas inlet, a gas outlet, a welded portion, and a water-cooling portion configured to water-cool a portion at least including the welded portion; an exhaust pump connected to the gas outlet; a dew point instrument disposed between the gas outlet and the exhaust pump, the dew point instrument being configured to measure a dew point of gas passing through the gas outlet.

4 Claims, 10 Drawing Sheets

(51) Int. Cl.
*C23C 14/24* (2006.01)
*C30B 23/06* (2006.01)
*C30B 29/36* (2006.01)
*C23C 14/06* (2006.01)
*C23C 16/32* (2006.01)
*C23C 16/448* (2006.01)
*C23C 16/452* (2006.01)
*H01L 21/02* (2006.01)

(52) U.S. Cl.
CPC ............ *C23C 16/32* (2013.01); *C23C 16/325* (2013.01); *C23C 16/448* (2013.01); *C23C 16/452* (2013.01); *C30B 23/06* (2013.01); *C30B 29/36* (2013.01); *H01L 21/0262* (2013.01); *H01L 21/02378* (2013.01); *H01L 21/02529* (2013.01); *H01L 21/02576* (2013.01)

(56) References Cited

U.S. PATENT DOCUMENTS

| | | | |
|---|---|---|---|
| 7,314,520 | B2 | 1/2008 | Powell et al. |
| 8,858,709 | B1 * | 10/2014 | Zwieback ............ C30B 11/002 117/105 |

FOREIGN PATENT DOCUMENTS

| | | | |
|---|---|---|---|
| JP | 2001-244201 A | | 9/2001 |
| JP | 2003-085618 | * | 3/2003 |
| JP | 2009-73696 A | | 4/2009 |
| JP | 2013-067523 A | | 4/2013 |
| JP | 2014-183136 A | | 9/2014 |
| JP | 6552460 B2 | | 7/2019 |
| WO | WO-99/07915 A1 | | 2/1999 |
| WO | WO-2011/024931 A1 | | 3/2011 |

* cited by examiner

⟨11-20⟩

CRYSTAL GROWTH APPARATUS, METHOD FOR MANUFACTURING SILICON CARBIDE SINGLE CRYSTAL, SILICON CARBIDE SINGLE CRYSTAL SUBSTRATE, AND SILICON CARBIDE EPITAXIAL SUBSTRATE

TECHNICAL FIELD

The present disclosure relates to a crystal growth apparatus, a method for manufacturing a silicon carbide single crystal, a silicon carbide single crystal substrate, and a silicon carbide epitaxial substrate.

BACKGROUND ART

U.S. Pat. No. 7,314,520 (Patent Document 1) discloses a method for manufacturing a silicon carbide single crystal substrate having a diameter of not less than 76 mm.

CITATION LIST

Patent Document

PTD 1: U.S. Pat. No. 7,314,520

SUMMARY OF INVENTION

A crystal growth apparatus in the present disclosure includes: a chamber including a gas inlet, a gas outlet, a welded portion, and a water-cooling portion configured to water-cool a portion at least including the welded portion; an exhaust pump connected to the gas outlet; a dew point instrument disposed between the gas outlet and the exhaust pump, the dew point instrument being configured to measure a dew point of gas passing through the gas outlet.

A method for manufacturing a silicon carbide single crystal in the present disclosure includes: preparing a chamber, a growth container, a source material, and a seed crystal, the chamber including a gas inlet, a gas outlet, a welded portion, and a water-cooling portion configured to water-cool a portion at least including the welded portion, the growth container being disposed in the chamber, the source material being disposed in the growth container, the seed crystal being disposed to face the source material in the growth container; and growing a silicon carbide single crystal on the seed crystal by sublimating the source material. In growing, a dew point of gas passing through the gas outlet is maintained at not more than −40° C.

A silicon carbide single crystal substrate in the present disclosure has a diameter of not less than 100 mm, has an oxygen concentration of not more than $1\times10^{17}$ cm$^{-3}$, has a dislocation density of not more than $2\times10^{4}$ cm$^{-2}$, and has a stacking fault area ratio of not more than 2.0%.

DESCRIPTION OF EMBODIMENTS

Figure 1:
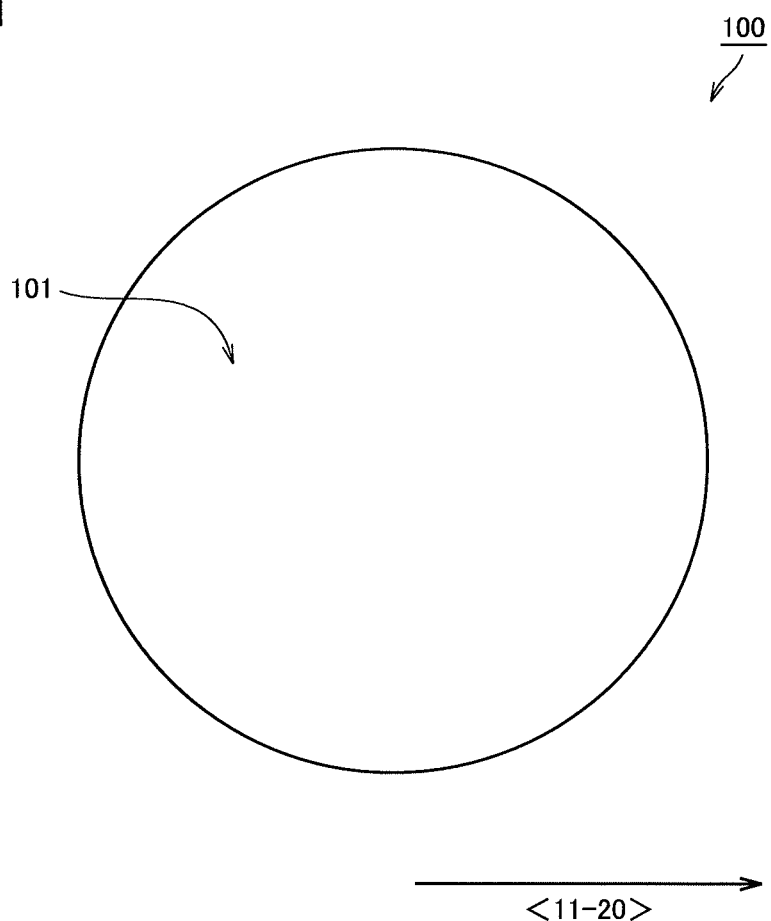
FIG. 1 is a schematic plan view showing an exemplary silicon carbide single crystal substrate of the present disclosure.

Description of Embodiments of the Present Disclosure

First, embodiments of the present disclosure are listed and described.

A crystal growth apparatus of the present disclosure includes: a chamber having a gas inlet and a gas outlet; an exhaust pump connected to the gas outlet; a dew point instrument disposed between the gas outlet and the exhaust pump, the dew point instrument being configured to measure a dew point of gas passing through the gas outlet.

Normally, a vacuum meter is attached to the crystal growth apparatus to manage a degree of vacuum during crystal growth. Moreover, the crystal growth is performed under flow of gas such as high-purity argon (Ar) gas. Hence, conventionally, no attention has been paid to mixing of an impurity from an atmosphere during growth. However, according to research by the present inventor, oxygen is included in a single crystal during growth, thereby causing dislocations and stacking faults. In other words, when an amount of oxygen is large, two-dimensional nucleus growth is likely to occur, thus resulting in increased dislocations and stacking faults. Part of the oxygen included in the single crystal on this occasion is originated from a very small amount of moistures included in the atmosphere during the growth. Such moistures cannot be recognized using a vacuum meter. Therefore, the dew point instrument is attached to the crystal growth apparatus as described above to manage the dew point in the chamber, thereby controlling the amount of oxygen to be included in the single crystal. By reducing the oxygen to be included in the single crystal, occurrence of two-dimensional nucleus growth can be suppressed. Accordingly, a single crystal having reduced dislocations and stacking faults can be grown.

Here, the chamber of the present disclosure includes: a welded portion; and a water-cooling portion configured to water-cool a portion at least including the welded portion.

[1] Specifically, a crystal growth apparatus according to the present disclosure includes: a chamber including a gas inlet, a gas outlet, a welded portion, and a water-cooling portion configured to water-cool a portion at least including the welded portion; an exhaust pump connected to the gas outlet; a dew point instrument disposed between the gas outlet and the exhaust pump, the dew point instrument being configured to measure a dew point of gas passing through the gas outlet.

A silicon carbide crystal is grown at a very high temperature. Accordingly, the chamber needs to be water-cooled partially or entirely. When a welded portion is located at a water-cooled portion, water for water-cooling may enter the chamber from the welded portion. As described above, the silicon carbide crystal is grown at a high temperature, so that heat cycle is applied to the welded portion. Due to this heat cycle, a very small pinhole may be formed in the welded portion. It is difficult to detect existence of such a very small pinhole using a vacuum meter. According to the crystal growth apparatus of the present disclosure including the dew point instrument as described above, it is possible to detect increase in moisture value caused by the very small pinhole.

[2] The chamber may further include a window portion configured to permit passage of light, and the window portion may be joined to the water-cooling portion by the welded portion. According to this configuration, for example, light having passing through the window portion is received by a radiation thermometer, whereby a temperature in the chamber can be measured. Deterioration of the welded portion that joins the window portion to the water-cooling portion can be detected by the dew point instrument.

[3] A method for manufacturing a silicon carbide single crystal in the present disclosure includes: preparing a chamber, a growth container, a source material, and a seed crystal, the chamber including a gas inlet, a gas outlet, a welded portion, and a water-cooling portion configured to water-cool a portion at least including the welded portion, the growth container being disposed in the chamber, the source material being disposed in the growth container, the seed crystal being disposed to face the source material in the growth container; and growing a silicon carbide single crystal on the seed crystal by sublimating the source material. In growing, a dew point of gas passing through the gas outlet is maintained at not more than −40° C.

In the manufacturing method, the silicon carbide single crystal is grown by a sublimation method. The sublimation method is also referred to as a sublimation-recrystallization method, a Modified-Lely method, or the like. By maintaining the dew point of the gas passing through the gas outlet at not more than −40° C. as described above, the dew point of the atmosphere in the growth container can be maintained at not more than −40° C. By strictly managing the moistures in the growth container in this way, oxygen to be included in the single crystal can be reduced. By reducing the oxygen to be included in the single crystal, occurrence of two-dimensional nucleus growth can be suppressed. Accordingly, dislocations and stacking faults can be reduced in the silicon carbide single crystal.

It is considered that the moistures causing increase of the dew point are originated from moistures attached when a member disposed in the chamber is exposed to atmospheric air. Hence, for example, in order to attain a dew point of not more than −40° C., the moistures attached to the member are desirably reduced sufficiently in advance by storing the member to be disposed in the chamber in a low dew point environment for a predetermined time or by heating and drying the member before growth, for example. Moreover, no pinhole should exist at the welded portion of the chamber.

[4] In growing, a dew point of the gas passing through the gas outlet is preferably maintained at not more than −50° C.

[5] In growing, a dew point of the gas passing through the gas outlet is preferably maintained at not more than −60° C.

[6] In growing, a dew point of the gas passing through the gas outlet is preferably maintained at not more than −80° C.

[7] A silicon carbide single crystal substrate in the present disclosure has a diameter of not less than 100 mm, has an oxygen concentration of not more than $1\times10^{17}$ cm$^{-3}$, has a dislocation density of not more than $2\times10^{4}$ cm$^{-2}$, and has a stacking fault area ratio of not more than 2.0%.

The oxygen concentration of not more than $1\times10^{17}$ cm$^{-3}$ in the crystal indicates that two-dimensional nucleus growth has been suppressed in the growth process. In the silicon carbide single crystal substrate having an oxygen concentration of not more than $1\times10^{17}$ cm$^{-3}$, the dislocation density can be not more than $2\times10^{4}$ cm$^{-2}$ and the stacking fault area ratio can be not more than 2.0%. Here, the oxygen concentration of not more than $1\times10^{17}$ cm$^{-3}$ can be attained by strictly managing moistures during crystal growth using the dew point instrument, for example. The oxygen concentration in the substrate can be measured, for example, by SIMS (Secondary Ion Mass Spectrometry). For primary ions of the SIMS, caesium (Cs) ions may be used.

In the silicon carbide single crystal substrate described above, the dislocation density is not more than $2\times10^{4}$ cm$^{2}$. The dislocation density can be measured as follows. First, for example, molten potassium hydroxide (KOH) or the like is used to etch the silicon carbide single crystal substrate. On this occasion, the temperature of the molten KOH is about 500 to 530° C., and etching time is about 5 to 10 minutes, for example. Next, the main surface of the silicon carbide single crystal substrate is observed using an optical microscope or the like to count the number of etch pits. By dividing the number of the etch pits by an area of the main surface of the silicon carbide single crystal substrate, the dislocation density can be determined.

In the silicon carbide single crystal substrate, the stacking fault area ratio is not more than 2.0%. The stacking fault area ratio can be measured as follows. When the main surface of the silicon carbide single crystal substrate does not correspond to the (0001) plane, the main surface is first polished to expose the (0001) plane on the main surface. Next, PL (Photoluminescence) mapping or PL imaging is employed to visualize stacking faults in the main surface. For an excitation light source, for example, a fourth harmonic wave (266 nm) of a YAG laser or the like can be used. The measurement environment may be at a room temperature. In a region having stacking faults, band edge emission is weaker than that in a region having no stacking faults. By using this characteristic, stacking faults can be visualized. By visualizing stacking faults in this way, areas of regions having stacking faults are measured. By dividing a total of the areas of the regions having the stacking faults by the area of the main surface, the stacking fault area ratio can be determined.

[8] The diameter of the silicon carbide single crystal substrate may be not less than 150 mm.

[9] The diameter of the silicon carbide single crystal substrate may be not less than 200 mm.

[10] A silicon carbide epitaxial substrate in the present disclosure includes: the silicon carbide single crystal substrate recited in any one of [7] to [9]; and an epitaxial layer disposed on the silicon carbide single crystal substrate and having an oxygen concentration of not more than $1\times10^{17}$ cm$^{-3}$.

The oxygen concentration of not more than $1\times10^{17}$ cm$^{-3}$ indicates that two-dimensional nucleus growth has been suppressed during epitaxial growth. Hence, dislocations and stacking faults can be reduced in the epitaxial layer, as with the silicon carbide single crystal substrate.

According to the description above, a silicon carbide single crystal substrate and a silicon carbide epitaxial substrate are provided, in each of which dislocations and stacking faults are reduced.

Details of Embodiment of the Present Disclosure

Although the following describes one embodiment (hereinafter, referred to as "the present embodiment") of the present disclosure in detail, the present embodiment is not limited to this. In the description below, the same or corresponding elements are given the same reference characters and are not described repeatedly. Regarding crystallographic indications in the present specification, an individual orientation is represented by [ ], a group orientation is represented by < >, and an individual plane is represented by ( ), and a group plane is represented by { }. Here, although a plane having a negative crystallographic index is normally expressed by putting "–" (bar) above a numeral, a negative crystallographic index is expressed by putting a negative sign before the numeral in the present specification.

First Embodiment: Silicon Carbide Single Crystal Substrate

A first embodiment is directed to a silicon carbide single crystal substrate. FIG. 1 is a schematic plan view showing an exemplary silicon carbide single crystal substrate according to the present embodiment. Silicon carbide single crystal substrate 100 has a diameter of not less than 100 mm. The diameter of silicon carbide single crystal substrate 100 may be not less than 150 mm, or may be not less than 200 mm. It is considered that as the diameter is larger, dislocations and stacking faults are more likely to be generated. Hence, it is expected that the effect of reducing the dislocations and stacking faults in the present embodiment is more noticeable as the diameter is larger. The upper limit of the diameter is not particularly limited. The upper limit of the diameter may be 250 mm, for example. The thickness of silicon carbide single crystal substrate 100 is also not particularly limited. The thickness of silicon carbide single crystal substrate 100 may be not less than 100 μm and not more than 10 mm, for example.

The polytype of silicon carbide single crystal substrate 100 is desirably 4H—SiC because 4H—SiC is more excellent than other polytypes in terms of electron mobility, dielectric strength, and the like. Silicon carbide single crystal substrate 100 is obtained by slicing a silicon carbide single crystal ingot. Silicon carbide single crystal substrate 100 may have a main surface 101 corresponding to a (0001) plane or (000–1) plane, or a plane inclined by a predetermined angle relative to the (0001) plane or (000–1) plane. When main surface 101 corresponds to the plane inclined relative to the (0001) plane or (000–1) plane, the plane may be inclined in a <11–20> direction. An inclination angle relative to the (0001) plane or (000–1) plane is also referred to as "off angle". The off angle may be not less than 1° and not more than 8°, for example. The upper limit of the off angle may be 7°, 6°, or 5°. The lower limit of the off angle may be 2° or 3°.

Figure 2:
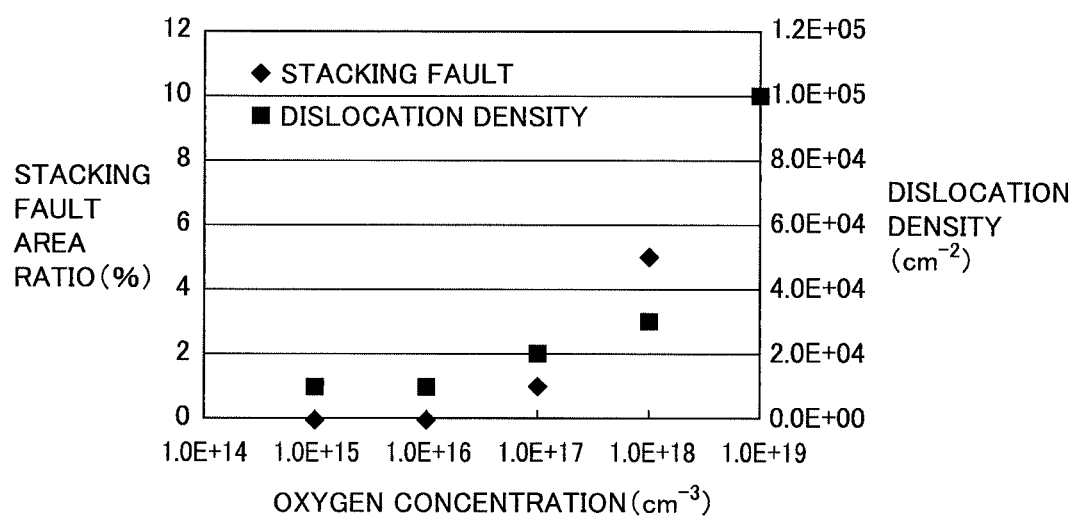
FIG. 2 is a graph showing an exemplary relation between an oxygen concentration and each of dislocation density and stacking fault area ratio of the silicon carbide single crystal substrate.

Silicon carbide single crystal substrate 100 according to the present embodiment has an oxygen concentration of not more than $1\times10^{17}$ cm$^{-3}$. It is considered that by growing the silicon carbide single crystal to have an oxygen concentration of not more than $1\times10^{17}$ cm$^{-3}$, occurrence of two-dimensional nucleus growth is suppressed, thus resulting in reduced dislocations and stacking faults. FIG. 2 is a graph including a plotted result of examining a relation between oxygen concentration and each of dislocation density and stacking fault area ratio in silicon carbide single crystal substrate 100 manufactured by the present inventor using the sublimation method. A specific numerical value of each point in FIG. 2 is shown in

TABLE 1

| Oxygen Concentration cm$^{-3}$ | Dislocation Density cm$^{-2}$ | Stacking Fault Area Ratio % |
|---|---|---|
| $1 \times 10^{15}$ | $1 \times 10^{4}$ | 0 |
| $1 \times 10^{16}$ | $1 \times 10^{4}$ | 0 |
| $1 \times 10^{17}$ | $2 \times 10^{4}$ | 1 |
| $1 \times 10^{18}$ | $3 \times 10^{4}$ | 5 |
| $1 \times 10^{19}$ | $1 \times 10^{5}$ | 10 |

In each of FIG. 2 and FIG. 7 below, "power of 10" is denoted as "E+00". For example, in FIG. 2 and FIG. 7, "E+17" represents "$10^{17}$". In FIG. 2, the horizontal axis represents the oxygen concentration, the vertical axis on the right side represents the dislocation density, and the vertical axis on the left side represents the stacking fault area ratio.

As shown in FIG. 2, as the oxygen concentration becomes lower, the dislocation density and the stacking fault area ratio are decreased. Both the dislocation density and the stacking fault area ratio are abruptly decreased when the oxygen concentration is decreased from $1\times10^{19}$ cm$^{-3}$ to $1\times10^{17}$ cm$^{-3}$. Thereafter, the dislocation density and the stacking fault area ratio are stable at low values. As apparent from FIG. 2, by controlling the oxygen concentration to be not more than $1\times10^{17}$ cm$^{-3}$, silicon carbide single crystal substrate 100 can have a dislocation density of not more than $2\times10^{4}$ cm$^{-2}$ and a stacking fault area ratio of not more than 2.0%. A smaller oxygen concentration is more preferable. The oxygen concentration is preferably not more than $1\times10^{16}$ cm$^{-3}$ and is more preferably not more than $1\times10^{15}$ cm$^{-3}$. By decreasing the oxygen concentration, the dislocation density can be not more than $1\times10^{4}$ cm$^{-2}$. Moreover, by decreasing the oxygen concentration, the stacking fault area ratio can be not more than 1%.

[Silicon Carbide Epitaxial Substrate]

Figure 8:
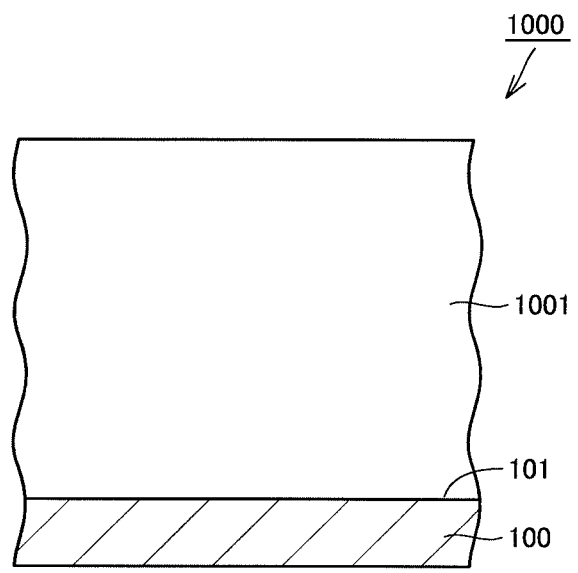
FIG. 8 is a schematic cross sectional view showing an exemplary silicon carbide epitaxial substrate of the present disclosure.

According to the present embodiment, a silicon carbide epitaxial substrate is also provided. FIG. 8 is a schematic cross sectional view showing an exemplary configuration of a silicon carbide epitaxial substrate according to the present embodiment. As shown in FIG. 8, a silicon carbide epitaxial substrate 1000 includes silicon carbide single crystal substrate 100 and an epitaxial layer 1001 disposed on silicon carbide single crystal substrate 100. As described above, silicon carbide single crystal substrate 100 has a diameter of not less than 100 mm, has an oxygen concentration of not more than $1\times10^{17}$ cm$^{-3}$, has a dislocation density of not more than $2\times10^{4}$ cm$^{-2}$, and has a stacking fault area ratio of not more than 2.0%.

Epitaxial layer 1001 is a silicon carbide single crystal layer grown epitaxially on a main surface 101 of silicon carbide single crystal substrate 100. A property of silicon carbide single crystal substrate 100 is transferred to epitaxial layer 1001. However, also in epitaxial growth, when there is a large amount of oxygen, two-dimensional nucleus growth may occur, which leads to increased dislocations and stacking faults. Hence, as with silicon carbide single crystal substrate 100, in order to obtain an epitaxial layer 1001 having reduced dislocations and stacking faults, the oxygen concentration of epitaxial layer 1001 is also required to be not more than $1\times10^{17}$ cm$^{-3}$. Also, the oxygen concentration of epitaxial layer 1001 can be measured by SIMS as with silicon carbide single crystal substrate 100. A smaller oxygen concentration of epitaxial layer 1001 is more preferable because the dislocations and stacking faults can be reduced. The oxygen concentration of epitaxial layer 1001 is preferably not more than $1\times10^{16}$ cm$^{-3}$, and is more preferably not more than $1\times10^{15}$ cm$^{-3}$.

Epitaxial layer 1001 may contain nitrogen as a dopant, for example. The nitrogen concentration of epitaxial layer 1001 is not less than $1\times10^{14}$ cm$^{-3}$ and not more than $1\times10^{16}$ cm$^{-3}$, for example. The thickness of epitaxial layer 1001 is not less than 1 µm, for example. The thickness of epitaxial layer 1001 may be not less than 10 m, or may be not less than 20 µm. Moreover, the thickness of epitaxial layer 1001 is not more than 200 µm, for example. The thickness of the epitaxial layer may be not more than 150 µm, or may be not more than 100 µm.

Second Embodiment: Crystal Growth Apparatus

A second embodiment is directed to a crystal growth apparatus. The crystal growth apparatus according to the present embodiment includes: a single crystal growth apparatus for growing a single crystal using the sublimation method; an epitaxial growth apparatus for growing an epitaxial layer on a substrate using vapor phase epitaxy such as CVD (Chemical Vapor Deposition); and the like.

[Single Crystal Growth Apparatus]

Figure 3:
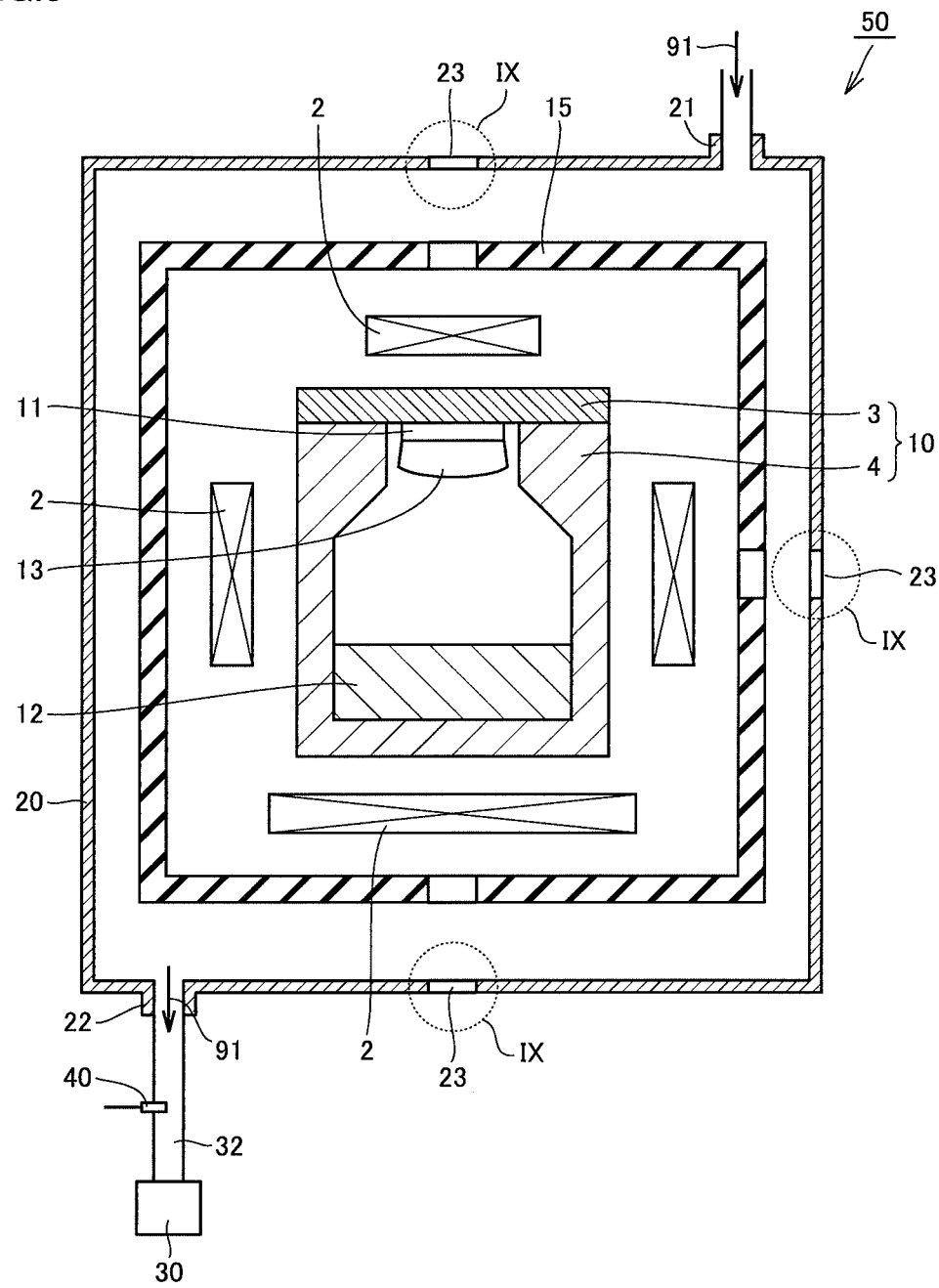
FIG. 3 is a schematic cross sectional view showing an exemplary configuration of a crystal growth apparatus of the present disclosure.

FIG. 3 is a schematic cross sectional view showing an exemplary configuration of the single crystal growth apparatus according to the present embodiment. An arrow 91 in FIG. 3 represents a flow path of gas. As shown in FIG. 3, crystal growth apparatus 50 includes a chamber 20 having a gas inlet 21 and a gas outlet 22. Chamber 20 may be composed of stainless steel or the like, for example. Gas outlet 22 is connected to an exhaust pump 30 via an exhaust tube 32. A dew point instrument 40 is disposed at exhaust tube 32. Dew point instrument 40 is disposed between gas outlet 22 and exhaust pump 30 in exhaust tube 32. The dew point of the gas passing through gas outlet 22 is measured by dew point instrument 40. The dew point measured by dew point instrument 40 can be regarded as a dew point in chamber 20. In order to suppress deterioration of dew point instrument 40, a filter (not shown) may be disposed between gas outlet 22 and dew point instrument 40.

Dew point instrument 40 may be any dew point instrument as long as the dew point instrument is capable of measuring a dew point in a range of 0° C. to −80° C. For example, "EAX-TX-100" provided by Michell Instruments or the like can be used. Alternatively, a dew point instrument having precision and measuring range equivalent to those of EAX-TX-100 may be employed.

In chamber 20, a growth container 10, a resistive heater 2, and a heat insulator 15 are disposed. Growth container 10, resistive heater 2, and heat insulator 15 are composed of graphite, for example. Growth container 10 includes a mount 3 and an accommodation portion 4. Mount 3 is configured to hold a seed crystal 11. Seed crystal 11 is a silicon carbide single crystal substrate having a polytype of 4H—SiC, for example. Mount 3 also functions as a cover of accommodation portion 4. Accommodation portion 4 has a cylindrical shape with a bottom, for example. Accommodation portion 4 can accommodate source material 12. Source material 12 is silicon carbide polycrystal powders, for example. In growth container 10, source material 12 and seed crystal 11 face each other.

Figure 9:
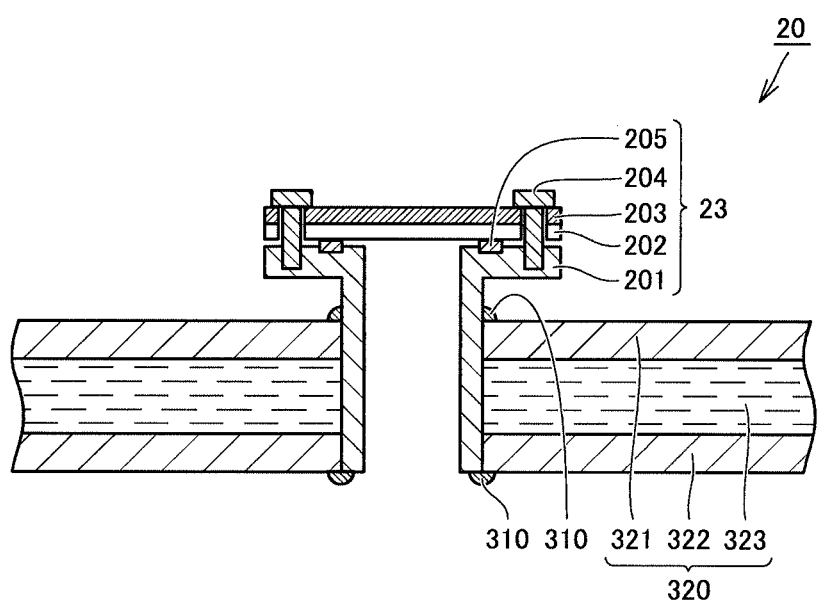
FIG. 9 is a schematic cross sectional view showing an exemplary configuration around a region IX of FIG. 3.
Figure 10:
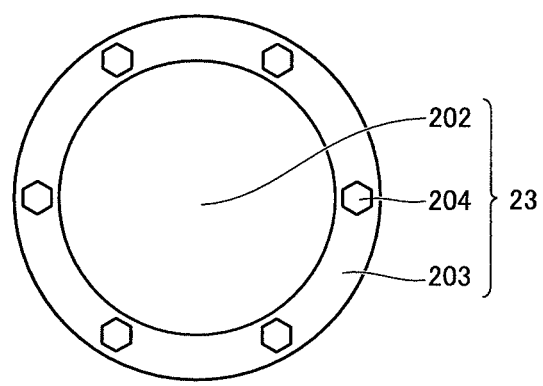
FIG. 10 is a schematic plan view showing an exemplary configuration of a window portion.

In crystal growth apparatus 50, a predetermined temperature gradient is formed in growth container 10 by resistive heater 2. Respective temperatures of portions of growth container 10 can be recognized using a radiation thermometer (not shown). Resistive heater 2 and heat insulator 15 are provided with holes to permit passage of light from each of the temperature-measured portions of growth container 10. The radiation thermometer receives the light from growth container 10 via a window portion 23 (view port) provided in chamber 20 to measure a temperature. As shown in FIG. 9 and FIG. 10 below, window portion 23 includes a window material 202 composed of quartz, for example. Since heat insulator 15 is provided with a hole, heat cycle is applied around window portion 23. Accordingly, a welded portion 310 around window portion 23 is deteriorated, with the result that external air and moistures presumably enter chamber 20 from welded portion 310. Such an abnormality can be also detected by dew point instrument 40.

FIG. 9 is a schematic cross sectional view showing an exemplary configuration around a region IX of FIG. 3. Chamber 20 includes welded portion 310. Moreover, chamber 20 includes a water-cooling portion 320 configured to water-cool a portion including welded portion 310. In other words, chamber 20 of the present disclosure includes gas inlet 21, gas outlet 22, welded portion 310, and water-cooling portion 320 configured to water-cool a portion at least including welded portion 310.

Water-cooling portion 320 includes an outer wall 321, an inner wall 322, and a water flow path 323. Water flow path 323 is located between outer wall 321 and inner wall 322. Water can flow in water flow path 323. Although only the periphery of window portion 23 is shown in FIG. 9, water-cooling portion 320 may extend to other portions not shown. That is, chamber 20 is configured to be partially or entirely water-cooled.

Window portion 23 includes a cylinder portion 201, a window material 202, a flange 203, a screw 204, and an O ring 205 (gasket). Cylinder portion 201 may be composed of stainless steel, for example. Cylinder portion 201 is joined to water-cooling portion 320 by welded portion 310. Welded portion 310 is provided at each of a portion at which outer wall 321 is in contact with cylinder portion 201 and a portion at which inner wall 322 is in contact with cylinder portion 201. Welded portion 310 located at a boundary between window portion 23 and water-cooling portion 320 is exposed to a strong heat cycle. This may cause, for example, a very small pinhole in welded portion 310 at the inner wall 322 side, with the result that moistures enter chamber 20 to decrease crystal quality.

Window material 202 and flange 203 are integrated with cylinder portion 201 by fastening screw 204. Window material 202 may be a plate composed of quartz or the like, for example. Flange 203 may be composed of stainless steel or the like, for example. O ring 205 is disposed between window material 202 and cylinder portion 201. By fastening screw 204, O ring 205 is compressed by window material 202 and cylinder portion 201, thereby sealing window portion 23. O ring 205 may be composed of a metal such as copper or may be composed of a rubber or the like having a predetermined heat resistance, for example.

FIG. 10 is a schematic plan view showing an exemplary configuration of the window portion. Each of window material 202 and flange 203 may have a circular planar shape, for example. From the center of flange 203, window material 202 is exposed. Light from heated growth container 10 passes through window material 202 to outside of chamber 20. That is, chamber 20 of the present disclosure further includes window portion 23 configured to permit passage of light, and window portion 23 is joined to water-cooling portion 320 by welded portion 310. This light is received by the radiation thermometer, thereby measuring the temperature of each portion of growth container 10.

From gas inlet 21 shown in FIG. 3, inert gas is introduced, such as Ar gas, helium (He) gas, or nitrogen ($N_2$) gas. Of course, the dew point of the introduced gas is also desirably not more than −40° C. The introduced inert gas is exhausted to outside by exhaust pump 30. The pressure in growth container 10 can be adjusted in accordance with flow rate of the introduced gas and exhausting performance of exhaust pump 30.

When the temperature and pressure in growth container 10 satisfy predetermined conditions, source material 12 is sublimated and is re-deposited on seed crystal 11. Accordingly, a silicon carbide single crystal 13 is grown on seed crystal 11. In crystal growth apparatus 50, the dew point of the gas passing through gas outlet 22 can be measured and monitored by dew point instrument 40. Accordingly, silicon carbide single crystal 13 can be grown while suppressing mixing of oxygen originated from a very small amount of moistures. By suppressing the amount of oxygen to be included in silicon carbide single crystal 13, occurrence of two-dimensional nucleus growth can be suppressed. As a result, dislocations and stacking faults are reduced in silicon carbide single crystal 13.

[Epitaxial Growth Apparatus]

Figure 4:
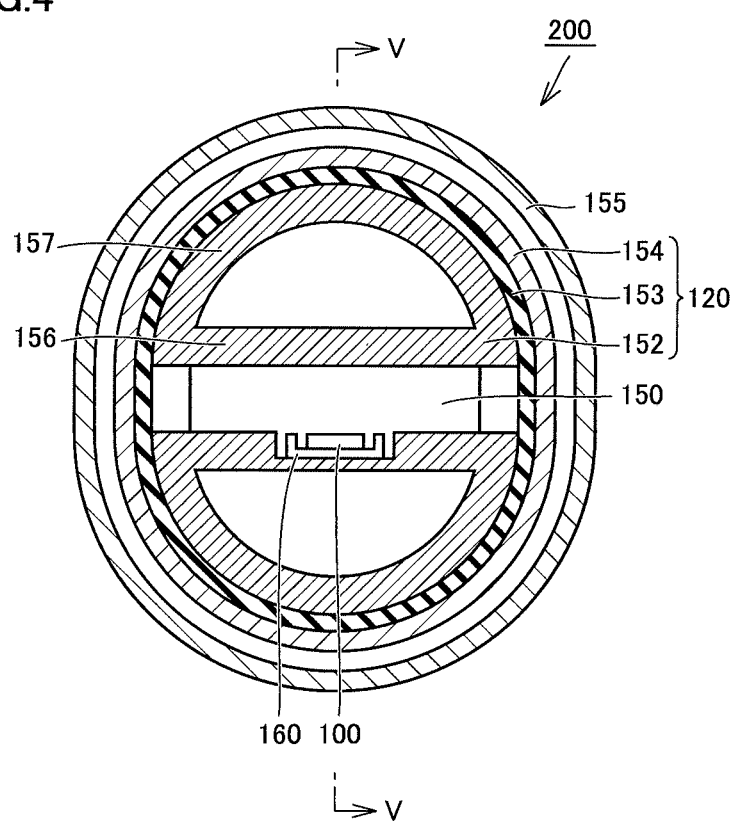
FIG. 4 is a schematic cross sectional view showing an exemplary configuration of an epitaxial growth apparatus of the present disclosure.
Figure 5:
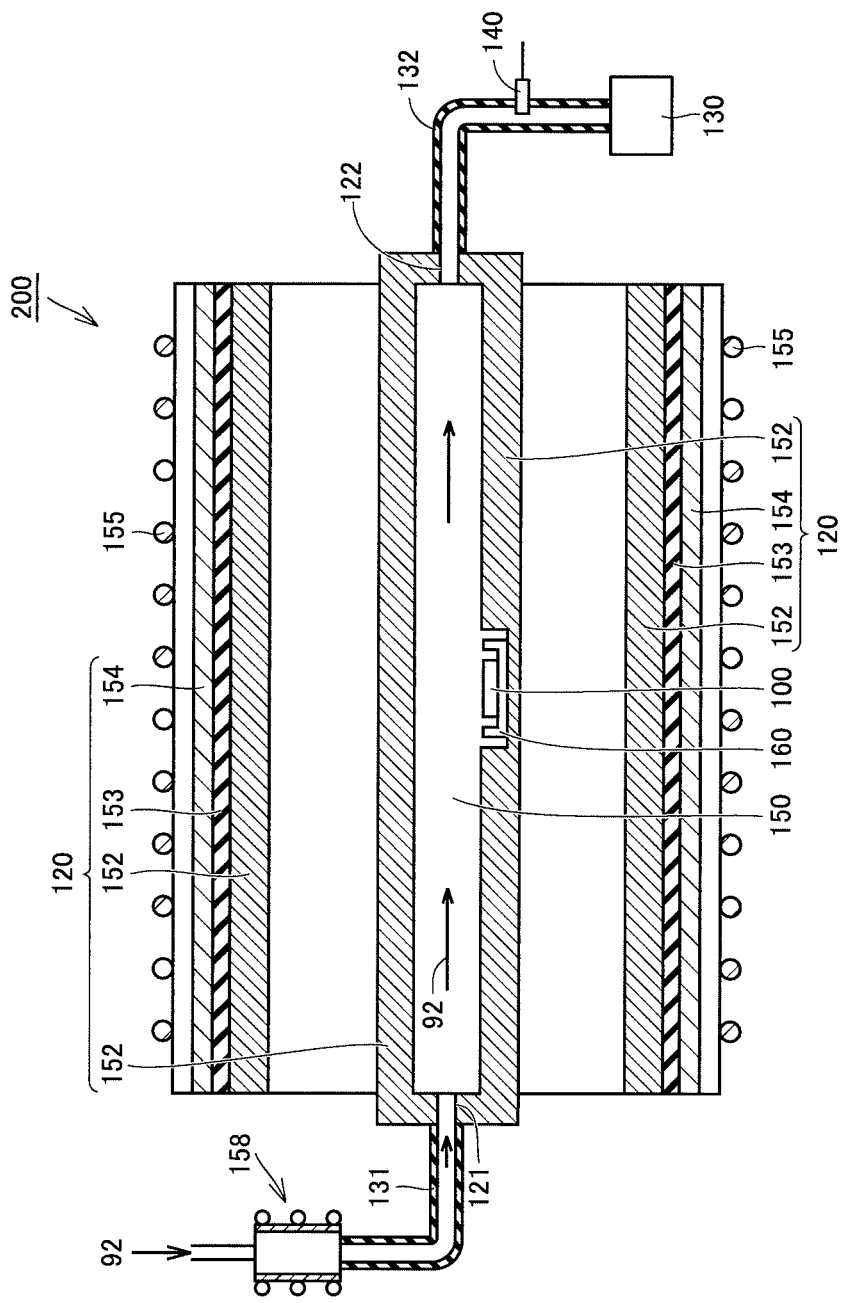
FIG. 5 is a schematic cross sectional view along a V-V line of FIG. 4.

FIG. 4 is a schematic cross sectional view showing an exemplary configuration of an epitaxial growth apparatus according to the present embodiment. A crystal growth apparatus 200 shown in FIG. 4 and FIG. 5 is a lateral type hot wall CVD apparatus. As shown in FIG. 4, crystal growth apparatus 200 includes heating elements 152, a heat insulator 153, a quartz tube 154, and an induction heating coil 155. Heating element 152, heat insulator 153, and quartz tube 154 are included in chamber 120.

As shown in FIG. 4, two heating elements 152 are provided. Each of heating elements 152 has a semi-cylindrical hollow structure including a curved portion 157 and a flat portion 156. Two flat portions 156 are disposed to face each other. A space surrounded by two flat portions 156 serves as a reaction chamber 150. One flat portion 156 is provided with a recess. A substrate holder 160 is provided in the recess. Substrate holder 160 is configured to hold silicon carbide single crystal substrate 100. Moreover, substrate holder 160 can be rotated. As described above, silicon carbide single crystal substrate 100 has a diameter of not less than 100 mm, has an oxygen concentration of not more than $1 \times 10^{17}$ $cm^{-3}$, has a dislocation density of not more than $2 \times 10$ $cm^{-2}$, and has a stacking fault area ratio of not more than 2.0%.

Heat insulator 153 is provided to surround the outer circumference portions of heating elements 152. Reaction chamber 150 is thermally insulated by heat insulator 153 from the outside. Quartz tube 154 is provided to surround the outer circumference portion of heat insulator 153. Induction heating coil 155 is wound along the outer circumference portion of quartz tube 154. When alternating current is supplied to induction heating coil 155, heating elements 152 are inductively heated.

In this way, the temperature in reaction chamber 150 can be controlled. When growing epitaxial layer 1001, the temperature in reaction chamber 150 is about 1500 to 1700° C., for example.

FIG. 5 is a schematic cross sectional view along a V-V line of FIG. 4. An arrow 92 in FIG. 5 represents a flow path of gas. A chamber 120 has a gas inlet 121 and a gas outlet 122. Gas outlet 122 is connected to an exhaust pump 130 via an exhaust tube 132. A dew point instrument 140 is disposed between gas outlet 122 and exhaust pump 130 in exhaust tube 132. The dew point of the gas passing through gas outlet 122 is measured by dew point instrument 140. The dew point measured by dew point instrument 140 can be regarded as a dew point in chamber 120.

In chamber 120, source material gas and carrier gas are introduced from an introduction tube 131. The dew points of these gases are also desirably not more than −40° C. The source material gas includes silane ($SiH_4$) gas, propane ($C_3H_8$) gas, and the like, for example. The source material gas may include ammonia ($NH_3$) gas or the like as a dopant gas, for example. The carrier gas may be hydrogen ($H_2$) gas or the like, for example. The ammonia gas in the source material gas is preferably thermally decomposed in advance before being supplied to reaction chamber 150, in order to improve in-plane uniformity of carrier concentration in epitaxial layer 1001. For example, the ammonia gas can be thermally decomposed using a preheating structure 158, for example. Preheating structure 158 may be an externally heated elongated tube, a chamber having an electric heating coil provided therein, or the like. The temperature of the inner wall surface of preheating structure 158 may be about 1300 to 1600° C., for example.

A pressure in reaction chamber 150 is adjusted in accordance with flow rates of the source material gas and carrier gas and exhausting performance of exhaust pump 130. When growing the epitaxial layer, the pressure in reaction chamber 150 is about 5 to 20 kPa, for example.

In crystal growth apparatus 200, epitaxial layer 1001 can be grown while measuring and monitoring the dew point in chamber 120. Accordingly, an amount of oxygen to be included in epitaxial layer 1001 can be controlled. By performing epitaxial growth to achieve an oxygen concentration of not more than $1 \times 10^{17}$ $cm^{-3}$, occurrence of two-dimensional nucleus growth can be suppressed. Accordingly, also in epitaxial layer 1001, dislocations and stacking faults can be reduced.

In the manner described above, silicon carbide epitaxial substrate 1000 can be manufactured, which includes: silicon carbide single crystal substrate 100; and epitaxial layer 1001 disposed on silicon carbide single crystal substrate 100 and having an oxygen concentration of not more than $1 \times 10^{17}$ $cm^{-3}$.

Third Embodiment: Method for Manufacturing Silicon Carbide Single Crystal

Figure 6:
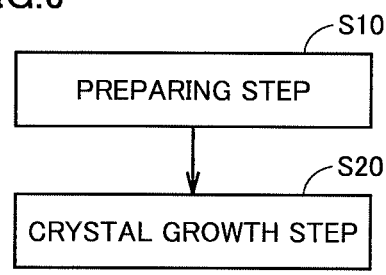
FIG. 6 is a flowchart schematically showing a method for manufacturing a silicon carbide single crystal of the present disclosure.

A third embodiment is directed to a method for manufacturing a silicon carbide single crystal. FIG. 6 is a flowchart schematically showing the manufacturing method. As shown in FIG. 6, the manufacturing method includes a preparing step (S10) and a crystal growth step (S20). Hereinafter, each of the steps will be described.

[Preparing Step (S10)]

In the preparing step (S10), crystal growth apparatus 50 shown in FIG. 3 is first prepared, for example. Specifically, there are prepared: chamber 20 including gas inlet 21, gas outlet 22, welded portion 310, and water-cooling portion 320 configured to water-cool a portion at least including welded portion 310; exhaust pump 30 connected to gas outlet 22; and dew point instrument 40 disposed between gas outlet 22 and exhaust pump 30.

Moreover, in the preparing step (S10), growth container 10 is prepared. Here, moistures attached to growth container 10 are desirably reduced in advance by storing growth container 10 in a low dew point environment for a predetermined time or by heating and drying growth container 10.

Here, the low dew point environment refers to an environment having a dew point of not more than −40° C., for example. The predetermined time is about 1 to 48 hours, for example.

Next, seed crystal 11 and source material 12 are disposed in growth container 10. Also, moistures attached to seed crystal 11 and source material 12 are desirably reduced in advance by storing seed crystal 11 and source material 12 in a low dew point environment for a predetermined time, for example. In growth container 10, seed crystal 11 is disposed to face source material 12. For example, seed crystal 11 may be adhered onto mount 3 using an adhesive agent. In this case, it is desired to heat the adhesive agent to reduce moistures after the adhesion. The diameter of seed crystal 11 is selected depending on a target diameter of silicon carbide single crystal 13. The diameter of seed crystal 11 is not less than 100 mm, for example. After seed crystal 11 and source material 12 are disposed in growth container 10, growth container 10 is disposed in chamber 20.

[Crystal Growth Step (S20)]

In the crystal growth step (S20), source material 12 is sublimated in growth container 10, thereby growing silicon carbide single crystal 13 on seed crystal 11.

Growth container 10 is heated by resistive heater 2. On this occasion, a temperature around seed crystal 11 is adjusted to be about 2000 to 2300° C., for example. Moreover, a temperature around source material 12 is adjusted to be about 2300 to 2500° C., for example.

From gas inlet 21, inert gas such as Ar gas is introduced. The introduced gas is exhausted from gas outlet 22 by exhaust pump 30. The pressure in chamber 20 is adjusted in accordance with flow rate of the introduced gas and exhausting performance of exhaust pump 30. The dew point of the gas passing through gas outlet 22 is monitored by dew point instrument 40. In the present embodiment, standby state is continued until the dew point of the gas passing through gas outlet 22 becomes not more than −40° C. while letting the gas flow with the pressure being maintained to be higher than a pressure at which source material 12 starts to be sublimated. After the dew point of the gas passing through gas outlet 22 becomes not more than −40° C., the pressure in chamber 20 is reduced to not more than 5 kPa, for example. Accordingly, source material 12 starts to be sublimated. The sublimated source material is re-deposited on seed crystal 11 and grows as silicon carbide single crystal 13.

In the present embodiment, the dew point of the gas passing through gas outlet 22 is always maintained at not more than −40° C. during crystal growth. FIG. 7 is a graph including a plotted result of examining a relation between the oxygen concentration in silicon carbide single crystal 13 grown by the present inventor using the sublimation method and the dew point of the gas passing through gas outlet 22. A specific numerical value of each point in FIG. 7 is shown in Table 2.

TABLE 2

| Dew Point °C. | Oxygen Concentration $cm^{-3}$ |
|---|---|
| 0 | $1 \times 10^{18}$ |
| −20 | $5 \times 10^{17}$ |
| −40 | $2 \times 10^{17}$ |
| −60 | $5 \times 10^{15}$ |
| −80 | $1 \times 10^{14}$ |

Figure 7:
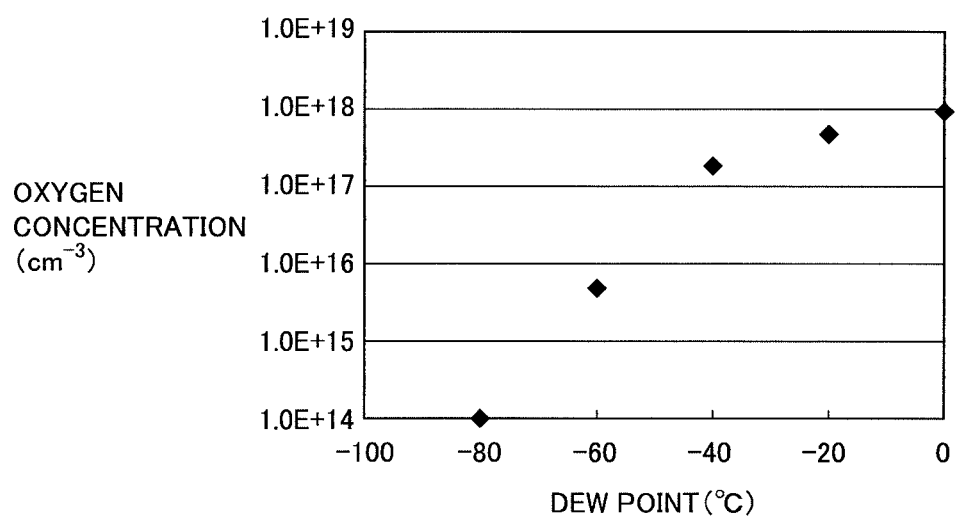
FIG. 7 is a graph showing an exemplary relation between an oxygen concentration of a grown crystal and a dew point of a growth atmosphere.

In FIG. 7, the horizontal axis represents the dew point in chamber 20 during crystal growth, i.e., the dew point of the gas passing through gas outlet 22, whereas the vertical axis represents the oxygen concentration of silicon carbide single crystal 13 after the growth. As shown in FIG. 7, as the dew point is decreased, the oxygen concentration is decreased. Particularly when the dew point becomes not more than −40° C., the oxygen concentration is abruptly decreased to be not more than $1 \times 10^{17}$ $cm^{-3}$. By setting the oxygen concentration to be not more than $1 \times 10^{17}$ $cm^{-3}$ as described above, it is possible to suppress occurrence of two-dimensional nucleus growth, which otherwise leads to increased dislocations and stacking faults. As shown in FIG. 7 and Table 2, as the dew point is lower, the oxygen concentration can be reduced. Therefore, it can be said that in the crystal growth step (S20), the dew point of the gas passing through gas outlet 22 is preferably maintained at not more than −50° C., is more preferably maintained at not more than −60° C., and is particularly preferably maintained at not more than −80° C.

The embodiments disclosed herein are illustrative and non-restrictive in any respect. The scope of the present invention is defined by the terms of the claims, rather than the embodiments described above, and is intended to include any modifications within the scope and meaning equivalent to the terms of the claims.

REFERENCE SIGNS LIST

2: resistive heater; 3: mount; 4: accommodation portion; 10: growth container; 11: seed crystal; 12: source material; 13: single crystal; 15, 153: heat insulator; 20, 120: chamber; 21, 121: gas inlet; 22, 122: gas outlet; 23: window portion (view port); 30, 130: exhaust pump; 32, 132: exhaust tube; 40, 140: dew point instrument; 50, 200: crystal growth apparatus; 91, 92: arrow; 100: silicon carbide single crystal substrate; 101: main surface; 131: introduction tube; 150: reaction chamber; 152: heating element; 154: quartz tube; 155: induction heating coil; 156: flat portion; 157: curved portion; 158: preheating structure; 160: substrate holder; 201: cylinder portion; 202: window material; 203: flange; 204: screw; 205: O ring (gasket); 310: welded portion; 320: water-cooling portion; 321: outer wall; 322: inner wall; 323: water flow path; 1000: silicon carbide epitaxial substrate; 1001: epitaxial layer.

The invention claimed is:

1. A method for manufacturing a silicon carbide single crystal, the method comprising:
    preparing a chamber, a growth container, a source material, and a seed crystal, the chamber including a gas inlet, a gas outlet, a welded portion, and a water-cooling portion configured to water-cool a portion at least including the welded portion, the growth container being disposed in the chamber, the source material being disposed in the growth container, the seed crystal being disposed to face the source material in the growth container;
    growing a silicon carbide single crystal on the seed crystal by sublimating the source material; and
    measuring a dew point of gas passing through the gas outlet,
    in growing, the dew point of gas passing through the gas outlet being maintained at not more than −40° C.

2. The method for manufacturing the silicon carbide single crystal according to claim 1, wherein in growing, a dew point of the gas passing through the gas outlet is maintained at not more than −50° C.

3. The method for manufacturing the silicon carbide single crystal according to claim 1, wherein in growing, a dew point of the gas passing through the gas outlet is maintained at not more than −60° C.

4. The method for manufacturing the silicon carbide single crystal according to claim 1, wherein in growing, a dew point of the gas passing through the gas outlet is maintained at not more than −80° C.

* * * * *